United States Patent [19]
Lee

[11] Patent Number: 5,754,063
[45] Date of Patent: May 19, 1998

[54] METHOD AND APPARATUS TO MEASURE INTERNAL NODE TIMING

[75] Inventor: Andy Lee, San Jose, Calif.

[73] Assignee: Intel Corporation, Santa Clara, Calif.

[21] Appl. No.: 670,303

[22] Filed: Jun. 27, 1996

[51] Int. Cl.$^6$ .................................................. H03K 5/19
[52] U.S. Cl. ........................... 327/18; 327/3; 327/43; 327/263; 327/277; 327/284
[58] Field of Search .................................. 327/3, 18, 43, 327/263, 277, 284

[56] References Cited

U.S. PATENT DOCUMENTS

| 5,159,205 | 10/1992 | Gorecki et al. | 327/284 |
| 5,381,416 | 1/1995 | Vartti et al. | 327/3 |
| 5,498,983 | 3/1996 | Schoellkopf | 327/3 |
| 5,621,360 | 4/1997 | Huang | 327/264 |

Primary Examiner—Margaret Rose Wambach
Attorney, Agent, or Firm—Kenyon & Kenyon

[57] ABSTRACT

Internal node timing on an integrated circuit which is supplied with a clock signal from a system clock, the cycle time of which can be varied is measured by connecting a sequential element such as a latch to the node to measured and clocking it with a delayed measurement clock while increasing the clock cycle time. The output of the sequential element is an output pin of said integrated circuit. The measurement clock has the same cycle time as the system clock but has a latching edge delayed, the delay being at least 1.5 times the nominal system clock cycle time when it is desired to make measurement over both the high phase and low phase. The output pin is observed and the clock cycle time at which the sequential element fails to latch the current value determined. In a further embodiment, two sequential elements are used to make two measurements of this type and the difference between the two measurements is used to compute the time delay between the two nodes being measured. One node may be a clock node. By using two such measurements the delay of the measurement clock need not be known. Because frequency is increased instead of decreased in this method and apparatus, it can be used to measure the timing of both static and dynamic circuits without affecting the normal operation of the designed circuit.

29 Claims, 4 Drawing Sheets

METHOD AND APPARATUS TO MEASURE INTERNAL NODE TIMING

BACKGROUND OF THE INVENTION

This invention relates to circuit measurement and testing in general and more particularly to a method and apparatus for measuring the internal node timings in a circuit such as an integrated circuit.

In testing silicon parts, i.e., integrated circuits, there is a need to test or measure the timing of internal nodes. Typical tester measurements for measuring internal node timing are done by placing sequential elements such as latches or flip-flops at the node at which the signal of interest appears, with the node connected to the data input of the sequential element. The output of the sequential element is typically brought out to an I/O pin. Measurements are then made by varying, the operating frequency until the sequential element fails to latch the correct value. By varying the operating frequency, the value latched by the sequential element will eventually change when the transition of the signal of interest fails to meet the set up time of the sequential element. On typical parts, the sequential elements are placed at the end of a phase/cycle since the clock signal driving them only exists at those times.

For signals that transition in the middle of a phase, this method fails. Although it is possible to connect a sequential element to such a node and vary the frequency at a higher frequency, this requires the cycle time to be less than the nominal cycle time in order to latch the node transition. For strictly static circuits, this is not desirable since the circuit can no longer operate at its nominal frequency and thus may not function properly. For a dynamic circuit, i.e., a circuit which precharges during one part of the cycle and has a conditional discharge during the second part of the cycle, this poses an even larger problem since shrinking clock cycle time will also decrease the precharge time of the circuit and the circuit will fail.

Thus, there is a need for an improved method and apparatus to measure internal node timing, which allows measurements to be made by examining a signal present at an I/O pin, of any arbitrary node, regardless of when it transitions in the clock cycle. Furthermore, such an apparatus should be applicable to both static and dynamic circuits.

SUMMARY OF THE INVENTION

The present invention provides such a method and apparatus. In order to permit measurement of internal nodes for both static and dynamic circuits, sequential elements are connected to the nodes of interest in a manner similar to that described above. However, instead of clocking these sequential elements with the standard clock signal, a special probe clock is used. The probe clock is derived from another clock, e.g., the system clock, as a delayed version of that clock, delayed with respect to the nominal cycle time. The timing measurement is again made by varying the frequency. However, instead of decreasing the cycle time to measure the transition, the cycle time is increased. The output of each sequential element, as the frequency is decreased, is observed to see when the latched value into the sequential element changes value. Since the present invention does not decrease the clock cycle time, internal node transitions for both static and dynamic circuits can be measured without affecting the normal operation of the circuit.

In a second embodiment, two sequential elements are used to measure the timing, at two nodes and the difference in cycle time used to determine relative timing delay. One node can be a clock node and the other a circuit node. With this method, the measurement is independent of the probe clock delay.

Thus, the present invention provides a method and apparatus to measure internal node times in real silicon. This is useful for silicon debug of production parts as well as test chips.

DETAILED DESCRIPTION

Figure 1:
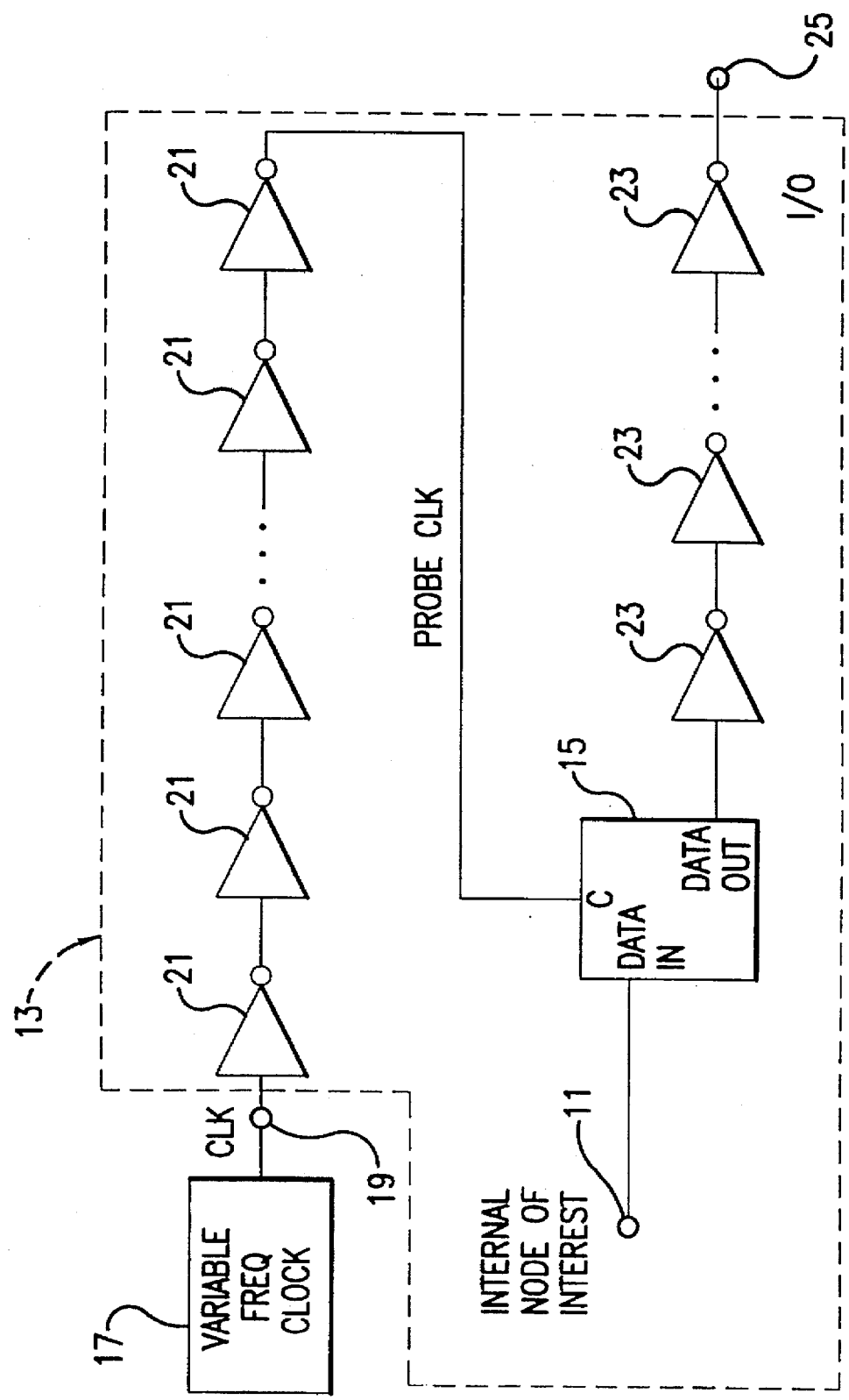
FIG. 1 is a logic diagram of a first embodiment of the present invention.

FIG. 1 illustrates the arrangement of the present invention in a first embodiment. The node of interest 11 is an internal node on a chip, i.e., an integrated circuit 13. All of the elements within the dotted lines are contained on this circuit. The circuit, of course, contains additional elements and can contain more than one node of interest. For purposes of illustration, only one node is shown in FIG. 1. Coupled to the node of interest is a sequential element 15, such as a high phase latch, (i.e., a latch which is transparent during the high phase, but latches data on the falling edge of a clock) having a data input which is coupled to node 11 and having a clock input C and a data output. In accordance with the present invention, a clock signal clk is supplied by a variable frequency clock 17 to an input terminal 19 on the integrated circuit. Although clock 17 is shown as an external clock coupled to the integrated circuit 13 directly, e.g., as a system clock, it may also be an internal clock. In either case, the clock 17 provides an output clk. A 50% duty cycle clock is assumed in the examples but the method is applicable for any duty cycle.

Within the integrated circuit the signal clk from the output of clock 17 is delayed by a set number of inverter stages 21. In the illustrated embodiment, the delay is selected to be greater than 1.5 times the clk cycle time. For example, a chain of 25 inverters will provide a delay of 6.6 ns for a 4.4 ns nominal clock cycle time. In the embodiment illustrated, an odd number of invertors and a high phase latch are used. Alternatively, an even number of inverter stages and a low phase latch; an odd number of inverter stages and a low phase latch; or an even number of inverters and a high phase latch could also be used. This would then change the triggering edge of probeclk, which still must be delayed at least 1.5 times the clk cycle, if it is desired to be able to measure all transitions during both the high and low phases. This amount of delay is necessary if it is desired to be able to measure transitions during all of the high and low phase. A shorter delay can be used if it is only required to make measurements over a portion of the total cycle, for example, if measurements were to be made only during the high phase or low phase then a minimum delay of 0.5 times the cycle time would suffice.

The output of the set number of inverter stages is designated probeclk and forms the measurement clock. It is provided as the C input to the latch 15. Latch 15 is a high phase latch, latching on the falling edge of probeclk. The data output of the latch 15 is buffered through a series of inverters 23 to an I/O pin 25 on the chip. It is not necessary to bring this output out to an I/O pin. During development, the data output of latch 15 can be measured on the chip.

Figure 2:
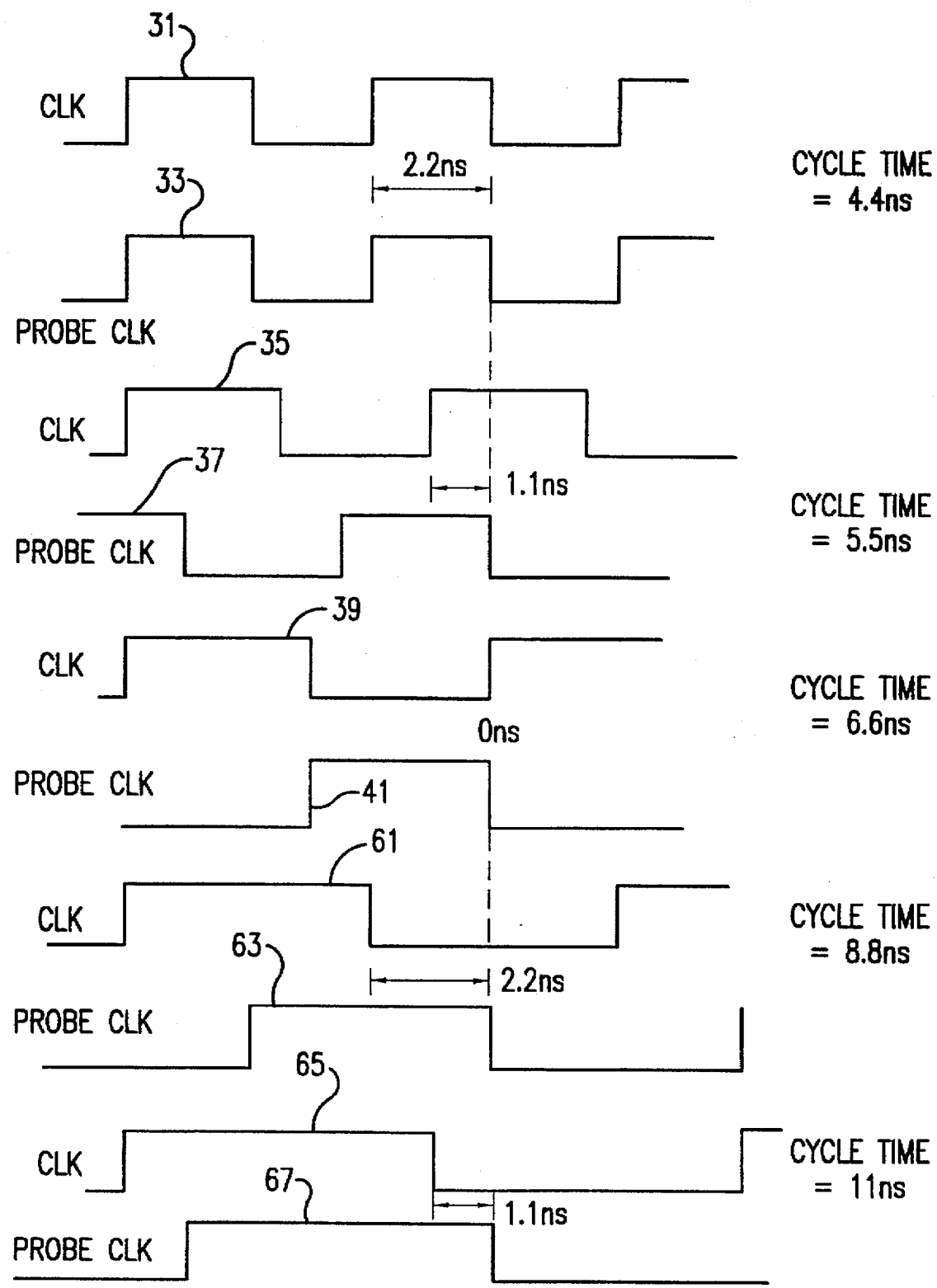
FIG. 2 is a timing diagram illustrating operation of the embodiment of FIG. 1.

By using the delayed probeclk signal generated in this manner to clock the sequential element such as the latch 15, increasing the cycle time will cause the sequential element 15 to latch data at varying times in either the low or high phase of the system clock. This is illustrated in FIG. 2 for a circuit with a nominal cycle time of 4.4 ns and a probeclk signal that is delayed 6.6 ns with respect to clk. In the example shown in FIG. 2 the cycle time of clk 31 is 4.4 ns. The falling edge of the signal probeclk 33 is delayed 6.6 nanoseconds (1.5 times the nominal clock cycle) from the rising edge of clk 31 and is inverted with respect to clk 31 and thus is in phase with the system clock. As a result, the latch 15 of FIG. 1 will latch high phase data on the falling edge of probeclk or 2.2 nanoseconds after the rising edge of clk. In the next example shown, clk 35 has its cycle time increased to 5.5 ns. The measurement clock probeclk 37 now has a falling edge which occurs 1.11 ns after a rising clock cycle and therefore will latch data at that time. Increases up to 6.6 ns, as shown by waveforms 39 and 41 result in the sequential element 15 of FIG. 1 latching data in the high phase of clk. Therefore any node transition triggered by the rising edge of clk can be latched. As used herein high phase transitions refer to transitions triggered by a rising clock edge and low phase transitions those triggered by a falling edge of the clock. It is noted that it is possible to have a transition triggered by the rising edge of a clock which occurs during the low phase of a signal in a static circuit.

As the clock cycle time is increased beyond 6.6 ns, up to 13.2 ns, which is three times the nominal clock cycle time, the sequential element latches such as latch 15 latch data in the lower phase of clk. This is illustrated by the waveforms 61, 63, 65 and 67 of FIG. 2. In these examples, the cycle time is first increased to 8.8 ns and then to 11 ns. For an 8.8 ns cycle time, probeclk 63 latches data 2.2 ns after the falling edge of clk 61; for a cycle time of 11 ns probeclk 67 latches data 1.1 nanoseconds after the falling edge of clk 65. Therefore any node transition triggered by the falling edge of the clock can also be latched.

Thus, the method and apparatus of the present invention allows the probeclk falling edge, which latches data into the sequential element 15 of FIG. 1, to occur at any time in either low or high phases. Therefore any internal node transition can be latched and thus measured at the chip I/O pins. It is again noted that the measurements are made by increasing the cycle time, i.e., decreasing frequency, rather than decreasing cycle time, i.e., increasing frequency as was done in the prior art. Therefore the circuit is never run faster than the nominal frequency at which it was designed.

In operation, it is then possible to vary the frequency over the high phase of the clock and the low phase of the clock and determine the point at which the value latched by the sequential element 15 eventually changes when the transition of the signal of interest fails to meet the setup time of the sequential element 15.

Figure 3:
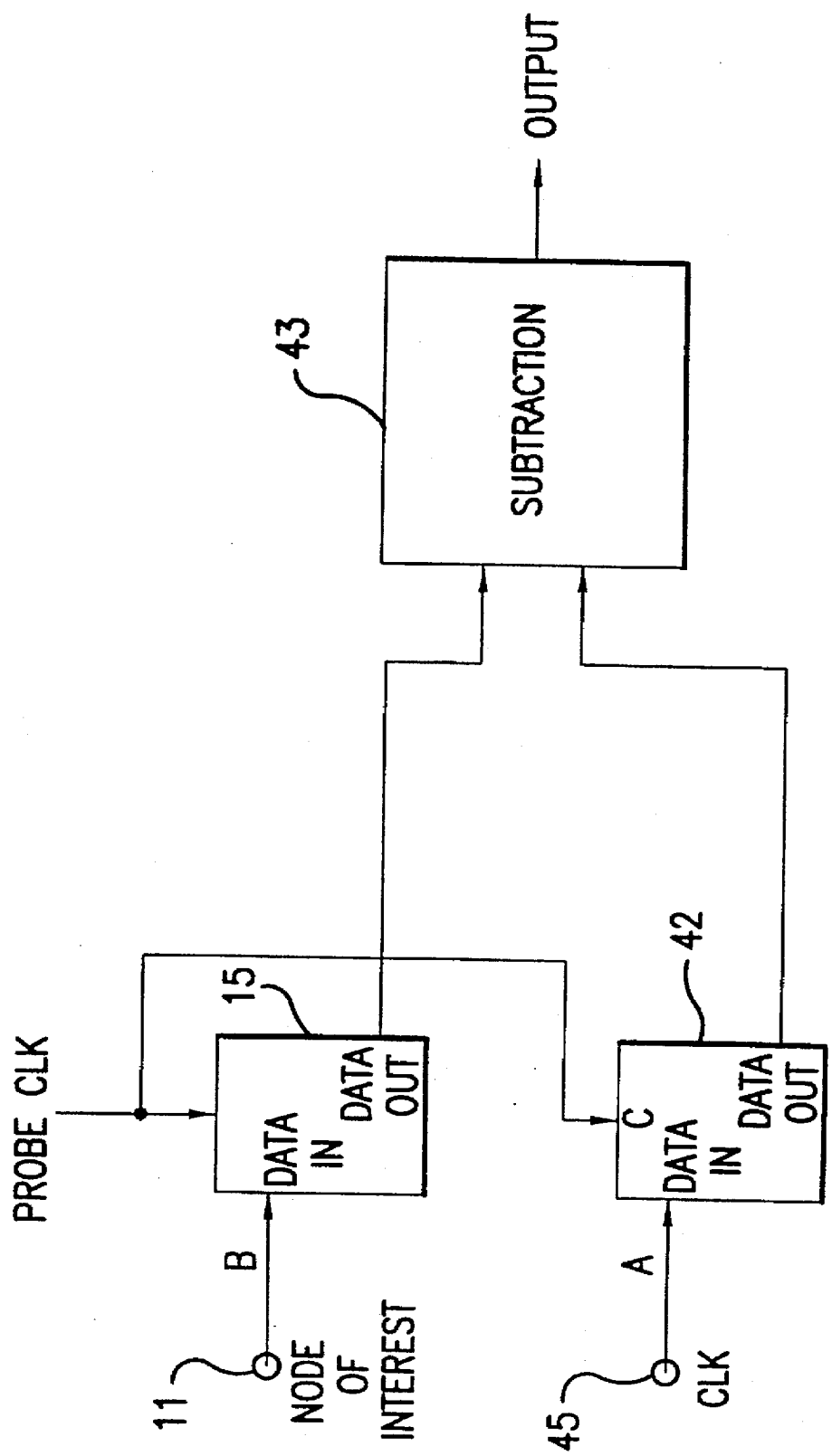
FIG. 3 is a logic diagram of the second embodiment of the present invention making differential measurements.

FIG. 3 illustrates a second embodiment of the present invention which utilizes a differential measurement. In the embodiment of FIG. 1, which uses a single latch for measurement, knowledge of the actual inverter chain delay is necessary to obtain accurate measurement data. The embodiment illustrated in FIG. 3 is independent of inverter chain delay. It is still necessary that the inverter chain delay be greater than 1.5 times the nominal clock cycle time to ensure sampling over the entire range of high and low phases. However, the exact delay need not be known. Referring to FIG. 2 it can be seen that, when using the method and apparatus of FIG. 1, in order to have a useful measurement, the time between the falling or rising edge of the clk signal and the falling edge of probeclk must be known. For this to be known, the amount of delay must be known. The embodiment of FIG. 3, avoids this problem by utilizing two latches measuring the two signals of interest, in the present case the signal clk and the node of interest. By using the two latches 15 and 42 shown in FIG. 3, a differential measurement is made to measure the delay between the system clock and the signal of interest irrespective of the actual inverter chain delay. It is preferable that latches 15 and 42 be placed in close proximity, if possible, so that clock skew between the latches 15 and 42 is minimized. Furthermore, the two latches 15 and 41 should be designed such that their setup time to failure is equal for both rising and falling transitions. By ensuring this, the actual delay between the two signals, in the illustrated embodiment between the system clock and the signal of interest, is accurately measured by taking the two independent measurements and subtracting the two measurements. Normally, the subtraction will be done manually. However, it can also be done in subtraction logic 43, as indicated in FIG. 3. The actual inverter chain delay and the latch setup time to failure is common mode for both latches and thus subtracts out. Using the apparatus of FIG. 3, very accurate measurement of internal node delays can be made. Error in measurement is limited by differences in setup time to failure between latches 15 and 42.

Figure 4:
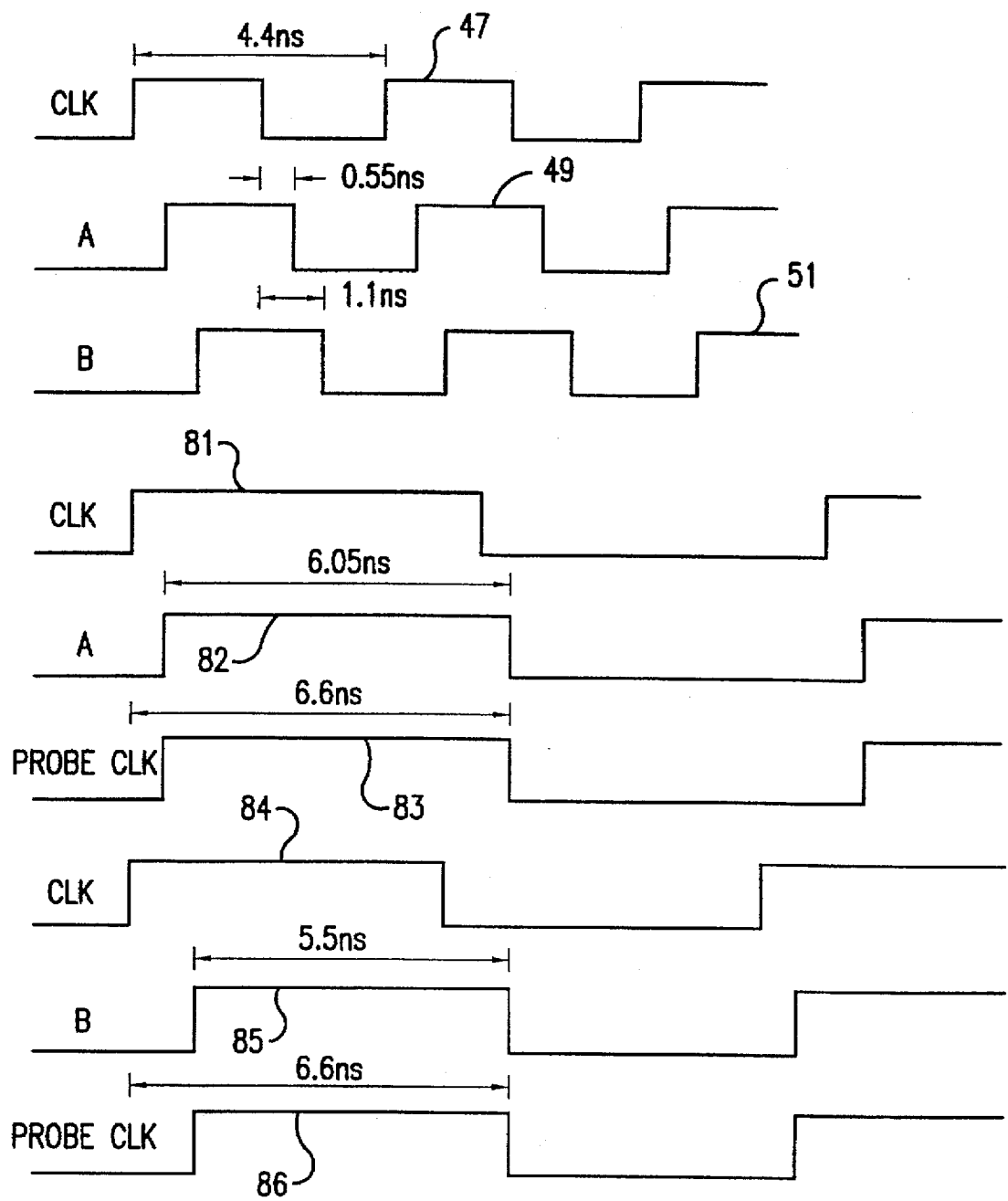
FIG. 4 is a timing diagram helpful, along with FIG. 2, in understanding the operation of the embodiment of FIG. 3.

FIG. 4 shows two signals, A and B, indicated by waveforms 49 and 51 respectively, with signal A delayed 0.55 ns from clk and signal B delayed 1.1 ns from clk, waveform 47. The delay of signal B with respect to signal A is 0.55 ns. That is to say, a falling edge of signal B occurs 0.55 ns after the falling edge of A. In using the apparatus of FIG. 3 timing measurements of signals A and B of FIG. 4 are taken at nodes 45 and 11 in the manner explained in connection with FIG. 2. In the example of FIG. 3 the node 11 of interest receives waveform 51 and the node 45 receives waveform 49. In FIG. 4 the waveform 81 represents the clk signal with its cycle extended to 6.05 ns. The original 4.4 ns cycle is shown as 47. As indicated in connection with FIG. 2, the probeclk, being delayed 6.6 ns will have its falling edge occur at the same time as the falling edge of the original signal clk. As shown by waveforms 81–83 with an increase in the clock cycle, all of the signals, including A and probeclk will have an increased cycle time.

Using the method and apparatus of the present invention, and varying the frequency, i.e., decreasing the frequency or increasing the clock cycle time, latching of the falling edge of A in the latch 15 of FIG. 3, as illustrated by waveforms 81–83, will occur when the clock cycle time reaches 6.05 ns. That is as the clk cycle time reaches 6.05 ns, as shown by waveforms 81, the falling edge of probeclk waveform 83 occurs just at the falling edge of waveform 82 for signal A.

On the other hand, latching of the falling edge of signal B will occur when the clock cycle time is 5.5 ns as shown by waveforms 84–86. By subtracting these two values, the delay of 0.55 ns between the signals will be obtained. This is the case for taking a measurement of delay between two signals whose transitions are triggered by rising edge of clock.

If a low phase measurement is to be taken, latching of the rising edge of signal A in the latch 15 will occur when the clock cycle time is 12.1 ns and latching of the rising edge of signal B in latch 42 will occur when the clock cycle time 11 ns. In the case, the delay is computed by taking the difference between 12.1 and 11 and dividing it by 2 to once again obtain the delay of 0.55 ns. Thus, for signals which transition in the high phase, the delay between the two signals is simply the difference between the two individual cycle time measurements divided by one. For signals transitioning in the low phase, the delay between the two signals is simply the difference between the two individual cycle time measurements divided by two.

The reason why the low phase difference must be divided by two can be seen from an examination of FIG. 2. It is evident that, for increases of the cycle time between the nominal cycle time of 4.4 ns and the cycle time of 6.6 ns, the time after the rising edge of the clock signal when probeclk latches the data decreases. Thus, at the cycle of 4.4 ns, it latches data 2.2 ns after the rising clock. At 5.5 ns it is 1.1 ns after the rising clock. The falling edge of probeclk can be thought of as moving to the left with respect to the high phase of the clk as cycle time increases. At a cycle time of 6.6 ns it has moved all the way to the left of the high phase of clk and is 0 seconds after the rising clock. Thus, there is a 1:1 relationship between the increase in cycle time and the decrease in the time after the rising edge of the clock signal when the falling edge of probeclk occurs. Conversely, when making low phase measurements, it can see that for the cycle time of 8.8, there is a 2.2 ns time difference between the falling edge of the clock signal 61 and the falling edge of probeclk 63. When the cycle time is increased to 11 ns, an increase of 2.2 ns, the time between the falling edge of the clock signal 65 and probeclk 67 decreases to 1:1 ns. In other words, the decrease is one-half of the increase in cycle time. Thus, there is a 1:1 relationship for high phase measurements and a 1:2 relationship for low phase measurements. The same would be true if an even number of inverters and a low phase latch is used, as well. This is the reason the result of the subtraction must be divided by two when making low phase measurements. Alternatively, if an odd number of inverters and a low phase latch are used or an even number of inverters and a high phase latch are used, then there is a 1:1 relationship for low phase measurements and a 1:2 relationship for high phase measurements.

What is claimed is:

1. Apparatus to measure internal node timing in a circuit which is supplied with a clock signal, the cycle time of which can be varied, comprising:
   a. a first sequential element having a data input, a clock input and a data output, the data input of said first sequential element connected to a node whose timing is to be measured; and
   b. a delay circuit having the clock signal as an input and providing a measurement clock output with the same cycle time as said clock but delayed with respect thereto, said measurement clock output coupled to the clock input of said first sequential element.

2. Apparatus according to claim 1 wherein said circuit includes I/O pins and further including:
   a first output circuit coupling the output of said first sequential element to an I/O pin of the circuit.

3. Apparatus according to claim 1 wherein the delay of said measurement clock with respect to said clock signal is at least 1.5 clock cycles.

4. Apparatus according to claim 1 wherein said sequential element comprises a latch.

5. Apparatus according to claim 1 wherein said delay circuit comprises a set number of inverter stages in series.

6. Apparatus according to claim 2 wherein said first sequential element, said first delay circuit and said first output circuit are formed on the integrated circuit.

7. Apparatus to measure internal node timing in a circuit which is supplied with a clock signal, the cycle time of which can be varied, comprising:
   a. a first latch having a data input, a clock input and a data output, the data input of said latch connected to a node whose timing is to be measured; and
   b. a set number of inverter stages in series having the clock signal as a input and providing a measurement clock output with the same cycle time as said system clock but delayed by at least 1.5 clock cycles, said measurement clock output coupled to the clock input of said sequential element.

8. Apparatus according to claim 7 wherein said circuit includes I/O pins and further including:
   c. at least one inverter coupling the output of said first sequential element to an I/O pin of the circuit.

9. Apparatus according to claim 7 wherein said sequential element comprises a latch.

10. Apparatus according to claim 8 wherein said first latch, said set number of inverter stages and said at least one inverter are formed on the integrated circuit.

11. Apparatus to measure internal node timing in a circuit which is supplied with a clock signal, the cycle time of which can be varied, comprising:
   a. a first sequential element having a data input, a clock input and a data output, the data input of said first sequential element connected to a node whose timing is to be measured;
   b. a delay circuit having the clock signal as a input and providing a measurement clock output with the same cycle time as said system clock but delayed with respect thereto, said measurement clock output coupled to the clock input of said sequential element; and
   c. a second sequential element having a data input, a clock input and a data output the data input of said second sequential element being coupled to a second node whose timing is to be measured and its clock input coupled to said measurement clock output.

12. Apparatus according to claim 11 and further including:
   d. subtraction logic having as inputs the data outputs of said first and second sequential elements and providing an output which is the time difference between transitions at the data outputs of said first and second sequential elements.

13. Apparatus according to claim 12 wherein said circuit includes I/O pins and further including:
   a. a first output circuit coupling the output of said first sequential element to an I/O pin of said circuit;
   b. a second output circuit coupling the output of said second sequential element to an I/O pin of said circuit.

14. Apparatus according to claim 13 wherein said first and second sequential elements, said delay circuit and said first and second output circuits are formed on the integrated circuit.

15. Apparatus according to claim 14 wherein said first and second sequential elements are located on the integrated circuit in close proximity to each other, with the same measurement clock output connected to their respective clock inputs.

16. Apparatus according to claim 11 wherein the delay of said measurement clock with respect to said clock signal is at least 1.5 clock cycles.

17. Apparatus according to claim 11 wherein said second node is said clock signal.

18. Apparatus according to claim 11 wherein said first and second sequential elements are latches.

19. A method of measuring internal node timing on an integrated circuit supplied with a clock signal, the cycle time of which can be varied, the circuit including a first sequential element having a data input, a clock input and a data output, the data input of said first sequential element coupled to a first node to be measured comprising:

c. generating a measurement clock signal having the same cycle time as said system clock signal but having a latching edge delayed with respect to the nominal clock cycle time;
  d. providing said measurement clock signal as a clock input to said first sequential element;
  e. varying the clock by increasing the clock cycle time above its nominal time; and
  f. observing the output of said first sequential element and detecting a first clock cycle time at which said first sequential element fails to latch the current value on said first node.

20. The method according to claim 19 wherein said measurement clock signal is delayed at least 1.5 clock cycles.

21. The method according to claim 20 wherein a second sequential element having a data input, a data output and a clock input is included on said integrated circuit, the data input of said second sequential element coupled to a second node to be measured, and further including:

e. observing the output of said second sequential element and detecting a second clock cycle time at which said second sequential element fails to latch the current value on said second node; and
  f. using said first and second clock cycle times to determine the delay between the timing at said first and second nodes.

22. The method according to claim 21 wherein step f comprises computing as the delay between transitions at said first and second nodes the difference between said first and second clock cycle times divided by one if the transitions at said first and second nodes are rising edge transitions and as the difference between said first and second clock cycle times divided by two if said transitions are falling edge transitions.

23. The method according to claim 21 wherein step f comprises computing as the delay between transitions at said first and second nodes the difference between said first and second clock cycle times divided by two if the transitions at said first and second nodes are rising edge transitions and as the difference between said first and second clock cycle times divided by one if said transitions are falling edge transitions.

24. The method according to claim 22 wherein one of said first and second nodes is a clock node.

25. The method according to claim 24 wherein said first and second sequential elements are in close proximity on said integrated circuits.

26. The method according to claim 25 wherein one of said first and second nodes is a clock node.

27. The method according to claim 26 wherein one of said first and second nodes is a clock node.

28. The method according to claim 27 wherein said first and second sequential elements are in close proximity on said integrated circuits.

29. The method according to claim 28 wherein one of said first and second nodes is a clock node.

* * * * *

UNITED STATES PATENT AND TRADEMARK OFFICE
CERTIFICATE OF CORRECTION

PATENT NO. : 5,754,063
DATED : 5/19/98
INVENTOR(S) : Lee

It is certified that error appears in the above-identified patent and that said Letters Patent is hereby corrected as shown below:

Column 3, line 20, "1.11" should be --1.1--

Signed and Sealed this

Twenty-second Day of June, 1999

Attest:

Q. TODD DICKINSON

*Attesting Officer*      *Acting Commissioner of Patents and Trademarks*